United States Patent [19]

Nesler

[11] 4,428,015
[45] Jan. 24, 1984

[54] OVERCURRENT LIMITER CIRCUIT FOR SWITCHING REGULATOR POWER SUPPLIES

[75] Inventor: John J. Nesler, Los Angeles, Calif.

[73] Assignee: Hughes Aircraft Company, El Segundo, Calif.

[21] Appl. No.: 333,356

[22] Filed: Dec. 22, 1981

[51] Int. Cl.³ .............................................. H02H 3/08
[52] U.S. Cl. ..................................... 361/18; 323/284; 323/285; 361/93
[58] Field of Search ............................ 361/18, 93, 98; 323/282, 284, 285, 287

[56] References Cited
U.S. PATENT DOCUMENTS

| | | | |
|---|---|---|---|
| 3,629,622 | 12/1971 | Denenberg, Jr. | 323/284 X |
| 3,736,469 | 5/1973 | Baugher et al. | 361/18 X |
| 3,906,310 | 9/1975 | Esashika | 361/18 X |
| 3,982,173 | 9/1976 | Berry et al. | 361/18 X |
| 4,278,930 | 7/1981 | Rogers | 323/285 |

Primary Examiner—Harry E. Moose, Jr.

Attorney, Agent, or Firm—W. J. Benman, Jr.; W. J. Bethurum; A. W. Karambelas

[57] ABSTRACT

A circuit is disclosed which provides overcurrent protection for switching regulator power supplies with soft start and soft turn OFF features. The invention includes first means for sensing the current through the switching transistor of the regulator and second means for providing a voltage signal to the switching transistor deactivation circuitry whenever the current through the switching transistor exceeds a predetermined threshold. In a specific embodiment, the current generator is provided by a transistor biased for nominal operation in its active mode. The means for sensing the current through the switching transistor is provided by a resistor the voltage drop across which provides the input voltage threshold to the bipolar transistor current generator. The current generated by the transistor causes a voltage to quickly develop across an RC network referenced to ground potential. This voltage is then compared to a reference potential by a comparator circuit which provides an electrical signal as an input to the base drive circuit for the switching regulator switching transistor.

10 Claims, 5 Drawing Figures

OVERCURRENT LIMITER CIRCUIT FOR SWITCHING REGULATOR POWER SUPPLIES

BACKGROUND OF THE INVENTION

1. Field of the Invention

This invention relates to switching regulator power supplies. More specifically, this invention relates to systems which provide overcurrent protection for such power supplies.

While the present invention is described herein with reference to a particular embodiment in a particular application it is to be understood that the invention is not limited thereto. Those having ordinary skill in the art to which this invention pertains will recognize modifications and other applications within the scope thereof.

2. Description of the Prior Art

As discussed by Abraham I. Pressman in *Switching and Linear Power Supply Design,* published by the Hayden Book Company in 1977, pages 183 through 185, the routine testing and maintenance of power supplies is such that the output of power supply may be accidentally shorted to ground. Overload currents may occur from a breakdown or malfunction in the load circuit. While most overload currents are usually temporary, it is desirable that they do not damage the power supply. For this reason, overcurrent protection circuits have been employed with some measure of success.

Prior art overcurrent protection circuits are primarily intended to protect against over dissipating linear mode series pass elements when an output node is shorted to ground. Although the prime reason for prior art overcurrent protection is to protect against such dead shorts at the output of the power supply, it is also useful to protect against smaller limited overcurrents above the maximum specified load current.

Pressman discusses two generally used modes of overcurrent protection: constant current and current foldback. In a constant current protection system, after output current is increased up to the maximum specified overload current, the output current is held constant. In a current foldback system, the output voltage remains constant and within specification limits up to a predetermined current level. Beyond this current level, the output voltage and the current start falling back along a "foldback" line.

For linear series pass regulators the current foldback technique may have advantages over the constant current technique. However, neither is directly applicable to a switching regulator type power supply. Prior art overcurrent limiters for switching regulators are adaptations of those previously developed for linear regulators. As such the prior art switching regulator overcurrent limiter circuits depend on the resetting of a switching inductor core. This may be costly and otherwise difficult to achieve.

In addition, hysterisis type switching regulators (non-clocked) using prior art overcurrent limiters, have a switching frequency that is related to the magnitude of the overload resistance. The switching frequency is very high for the "critical overload resistance" and lowest for a short circuit. The "critical overload resistance" is defined here as the load resistance slightly lower than the load resistance that barely trips the overcurrent limiter threshold setting.

The high switching frequencies obtained at the critical overload resistance usually exceed the power switching frequency ratings of both the transistor switch and the flyback diode. Thus, it is desirable to provide a power supply having a switching frequency which is held constant and at the highest safe switching rate for all overload resistances including the short circuit as well as the critical load resistance.

In addition, it is desirable to provide a power supply with soft start and soft turn OFF performance characteristics. A soft start may be required in the event that the load requires very high transient starting current. Capacitors, motors, and incandescent lamps are examples of loads requiring high transient starting current. A soft turn OFF may be required in the event that the source of unregulated power is switched off which causes a switching regulator to sense a voltage drop which it tries to compensate for by drawing more current through the switching transistor. In this mode, the unregulated power may be decaying down due to the slow discharge of an input filter capacitor. As a result, the power switch may have enough energy to be biased ON but not enough to be in saturation. In that event very high current may be drawn through the power switch in its active mode. This presents a hazard to a switching transistor without the soft turn OFF feature.

SUMMARY OF THE INVENTION

The present invention provides overcurrent protection for switching regulator type power supplies with soft start and soft turn OFF features. Generally, the invention includes first means for sensing the current through the switching transistor of the switching regulator, and second means for providing an electrical signal to the switching transistor deactivation circuitry whenever the current through the switching transistor exceeds a predetermined threshold.

In a specific embodiment overload current is sensed by a current generator provided by a transistor biased to detect the overload current. The means for sensing the overload current through the switching transistor is provided by a resistor, across which the voltage drop provides an input to the overload current detector. The current generated by the overload current transistor causes a voltage to develop across an RC integrator network which is referenced to ground level. This voltage is compared to a reference potential by an amplitude comparator circuit which provides an electrical signal as an input to the base drive circuit for the switching regulator switch transistor.

DETAILED DESCRIPTION OF THE INVENTION

Figure 1:
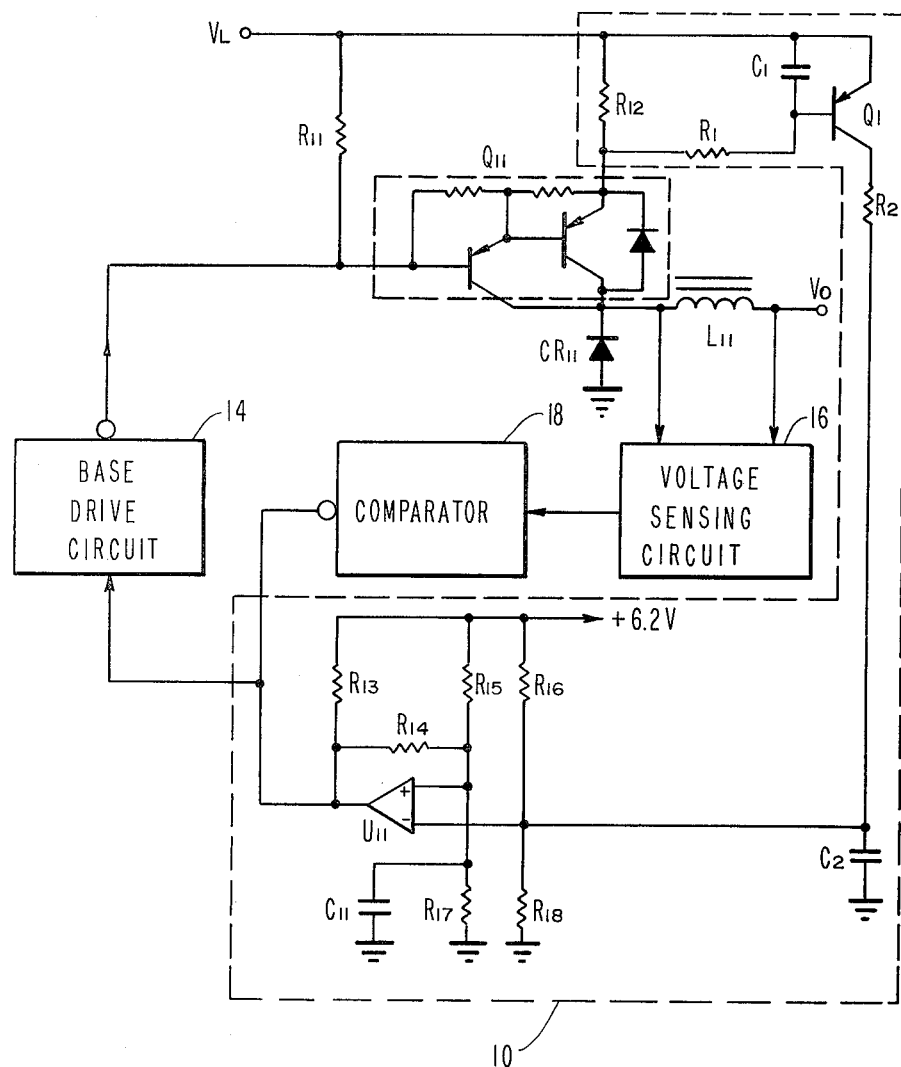
FIG. 1 is a schematic diagram representation of a first embodiment of the present invention.
Figure 2:
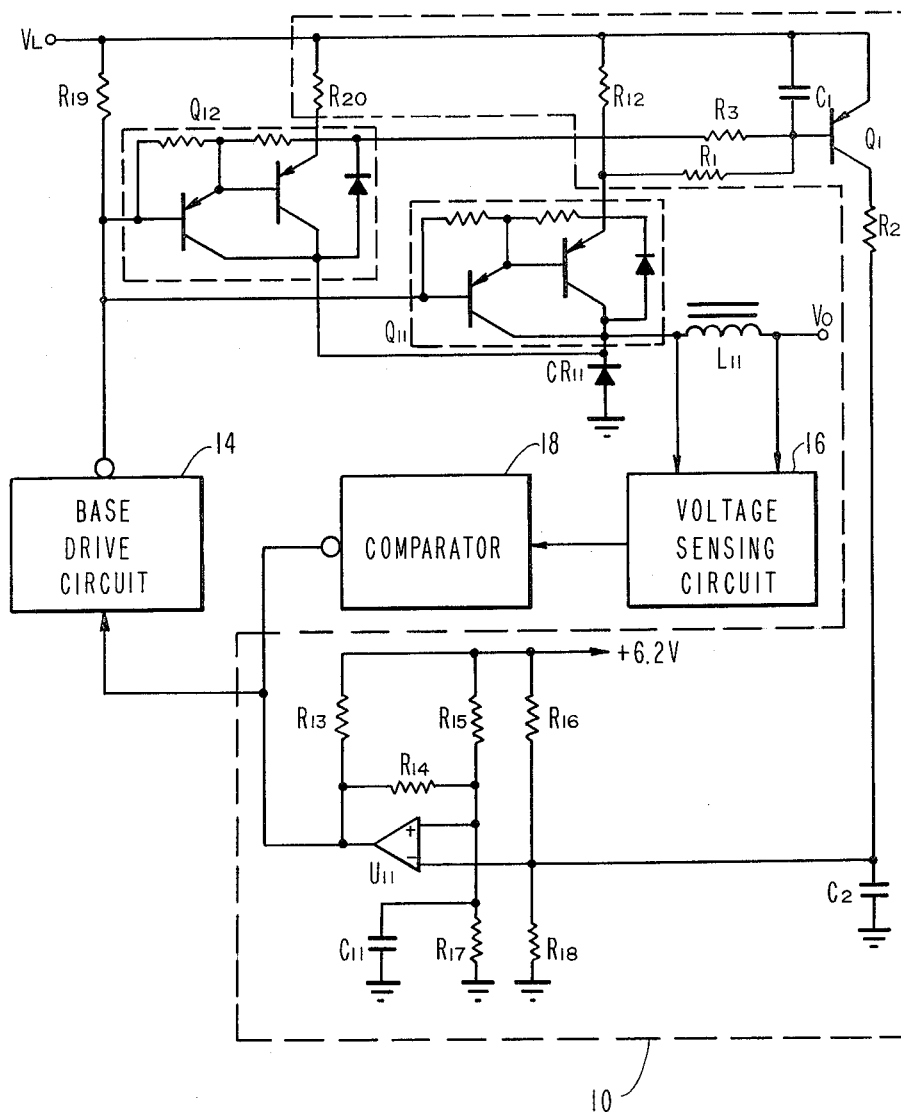
FIG. 2 is a schematic diagram representation of a second embodiment of the present invention.
Figure 3:
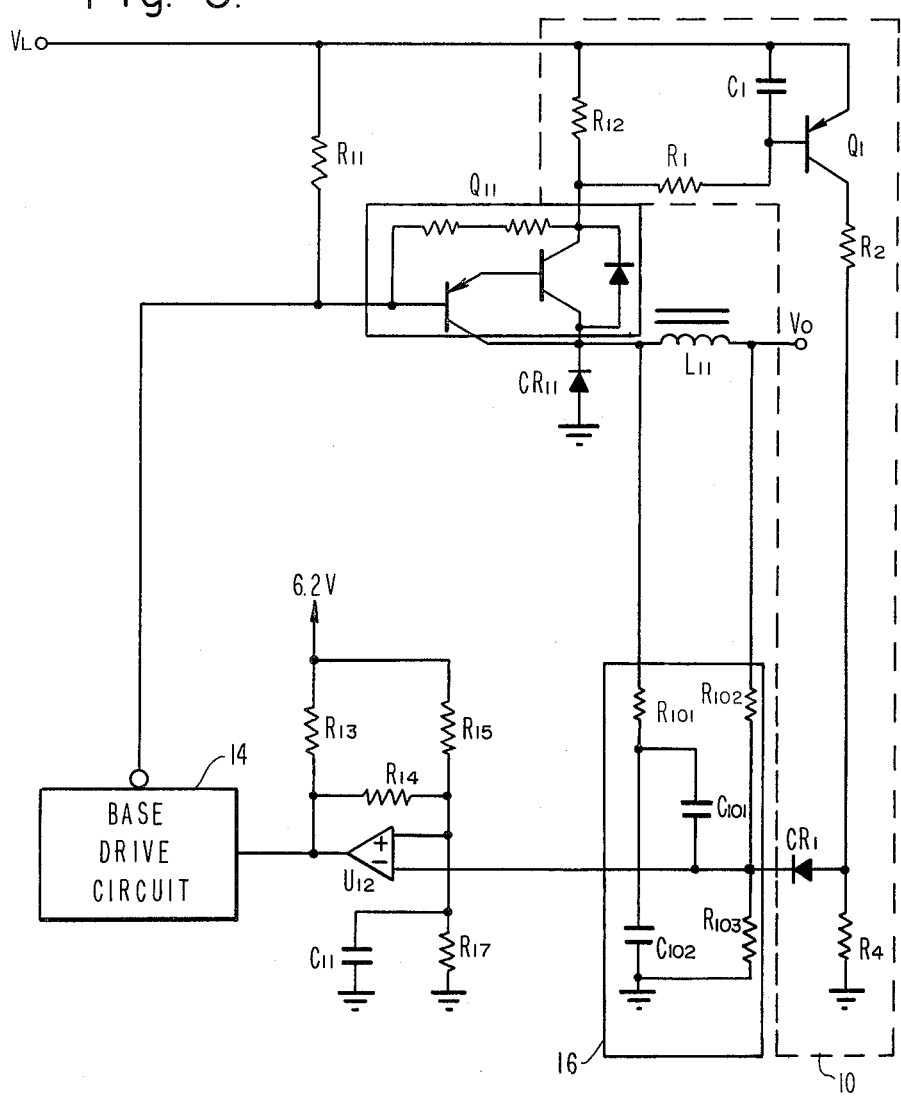
FIG. 3 is a schematic diagram representation of a third embodiment of the present invention.

The overcurrent protection circuit for switching regulator power supplies of the present invention are shown in FIGS. 1-3.

FIG. 1 shows the first of three embodiments of the invention. The overcurrent protection circuit of the present invention is shown generally at 10 within dashed lines. A power switching transistor $Q_{11}$ is driven by a base drive circuit 14. The switching transistor $Q_{11}$ is connected between a source of unregulated line voltage $V_L$ through resistor $R_{12}$ and is connected to a load at $V_o$ through inductor $L_{11}$. A flyback diode $CR_{11}$ is connected to the junction between the switching transistor $Q_{11}$ and inductor $L_{11}$ and ground. A voltage sensing circuit 16 is typically connected to $V_o$ to monitor the output voltage. The output of the voltage sensing circuit 16 is input to a hysteresis voltage comparator 18 which drives the base drive circuit 14.

The base drive circuit 14, the voltage sensing circuit 16, and the comparator 18 are shown in block diagram form to emphasize that these circuits may typically be provided in a switching regulator power supply. The design of these circuits is known to one of ordinary skill in the art. The details of these block diagrams are not required for an understanding of the present invention. For illustrative designs see U.S. Pat. Nos. 3,294,981 to Bose; 3,772,588 to Kelly et at; 3,931,567 to Kosteck; 4,034,280 to Cronin et al; and Pressman, Supra, pp. 321-235.

As mentioned above, the overcurrent limiter circuit of the present invention is shown at 10. It includes a resistor $R_{12}$ in the current path between the source of unregulated line voltage $V_L$ and the emitter of the switching transistor $Q_{11}$. The invention 10 also includes an amplitude comparator transistor $Q_1$ connected so that it floats above ground potential. The transistor $Q_1$ is base coupled to the emitter of the switching transistor $Q_{11}$ through a low pass filter, $R_1$ and $C_1$. The resistor $R_{12}$ provides a current sensing resistor in that its voltage drop is input to $Q_1$ through the $R_1/C_1$ filter.

The resistor $R_1$ between the emitter of the transistor $Q_{11}$ and the base of the transistor $Q_1$ and the capacitor $C_1$ across the base emitter junction of the transistor $Q_1$ provides a low pass RC filter. This RC filter removes from the base of the transistor $Q_1$ the large amplitude, fast (nanosecond) voltage spikes appearing across $R_{12}$ caused by the flow of current through $CR_{11}$ to ground at the instant $Q_{11}$ turns ON. Though $CR_{11}$ is typically a fast recovery diode, it has a finite recovery time. During its recovery time, it is in a conduction mode which permits current to flow through the switching transistor $Q_{11}$ to ground. During $CR_{11}$ recovery interval, current surges through $CR_{11}$ as if it were momentarily shorted. The low pass filter provided by the combination of resistor $R_1$ and capacitor $C_1$ prevent these diode recovery current spikes from falsely triggering the overcurrent amplitude detector (current generator) $Q_1$. Using the component values shown in Table I below, the RC time constant of the filter is approximately 1 microsecond. As such, the filter does not appreciably delay inherent response time of the overcurrent limiter circuit 10.

Resistor $R_2$ is connected in the collector path of the transistor $Q_1$ simply to provide parasitic oscillation suppression when $Q_1$ is in the linear mode. In this configuration, $Q_1$ is both a floating overcurrent detector and a current generator. $Q_1$ is either OFF when there is no overload current or is in the linear mode when there is an overload through the power supply switching transistor $Q_{11}$. Upon an overcurrent detection, the $Q_1$ base voltage ramps linearly into the $Q_1$ active region so that the $Q_1$ collector current resembles a linear current ramp. (To be more precise, the collector current through $Q_1$ is nonlinear is $Q_1$ moves out of collector cut-off. However, for practical purposes, the $Q_1$ collector current is a pseudo-linear increasing function.)

A capacitor $C_2$ is mounted in the collector path of transistor $Q_1$ to receive current from $Q_1$ at ground potential. The resulting voltage drop across the capacitor $C_2$ provides one of the differential inputs to a comparator circuit including amplifier $U_{11}$, resistors $R_{13}$ through $R_{18}$ and capacitors $C_{11}$. Resistors $R_{15}$ and $R_{17}$ set the comparator threshold level. Capacitor $C_{11}$ forms a low pass filter to minimize noise interference for the 2 level (hysteresis) reference potential of comparator $U_{11}$. $R_{14}$ establishes the amount of hysteresis of comparator $U_{11}$; i.e., the upper and lower trip level (UT and LT) of comparator $U_{11}$. $R_{13}$ is the pull-up resistor for the "wired OR" circuit at the output of comparator $U_{11}$ and block diagram 18.

The voltage drop across capacitor $C_2$ is applied to the comparator $U_{11}$ through a voltage divider consisting of resistors $R_{16}$ and $R_{18}$. $R_{16}$ and $R_{18}$ also provide a discharge path for the capacitor $C_2$. As a result, the time constant of the $C_2$ decay voltage is $C_2$ times the parallel combination of resistors $R_{16}$ and $R_{18}$. $C_2$ charges quickly by integrating the current ramp from $Q_1$ and discharges slowly through $R_{16}$ and $R_{18}$.

The capacitor $C_2$ integrates the linear collector current ramp from $Q_1$. The overcurrent comparator $U_{11}$ changes state after the voltage across capacitor $C_2$ rises above its steady state value to the upper trip point (UT) of the comparator $U_{11}$. The change of the state of the comparator $U_{11}$ initiates overcurrent turn OFF of $Q_{11}$ via the "wired OR" connection to the base drive circuit 14. Upon turn OFF of $Q_{11}$, $Q_1$ turns OFF (in about a microsecond) as soon as capacitor $C_1$ discharges a fraction of a volt. $Q_{11}$ and $Q_1$ remain OFF until the voltage across $C_2$ decays about one half volt (using the parameters specified in Table I below) which is the hysteresis of the comparator $U_{11}$. This charging and discharging of $C_2$ and the comparator hysteresis form a relaxation oscillator to set the switching regulator frequency and duty cycle during any overload condition.

Figure 4A:
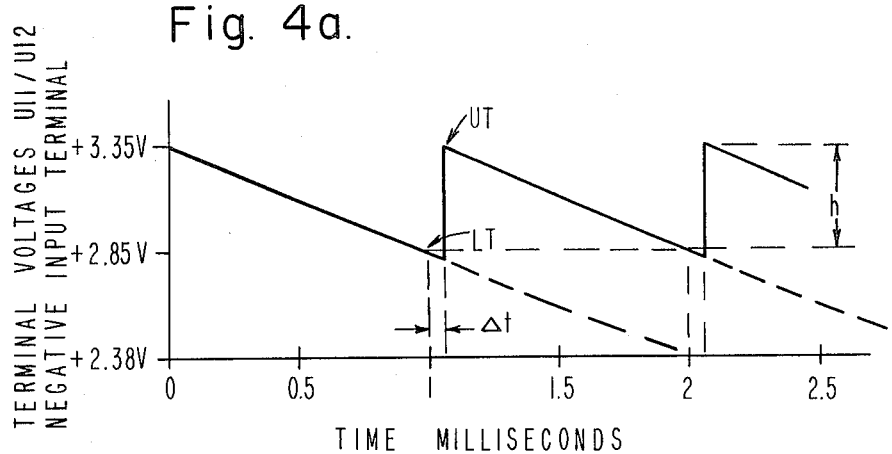
FIGS. 4a and 4b show voltage waveforms to further illustrate the operation of the present invention.
Figure 4B:
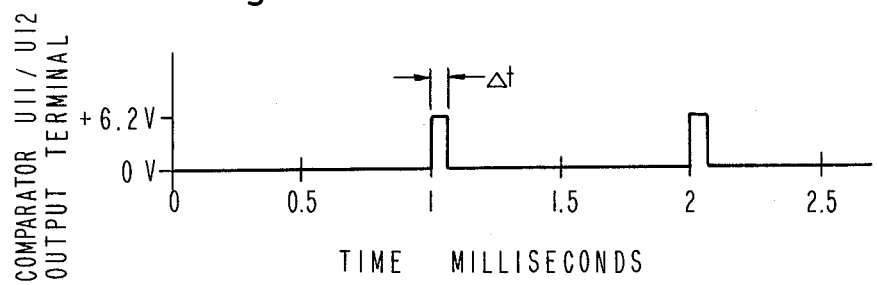

The waveform occuring across $C_2$ for a continuous overload condition is shown in FIG. 4 for the parameters specified in Table I below. FIG. 4a shows the voltage waveform across capacitor $C_2$, and FIG. 4b shows the voltage waveform at the comparator output. Note that the voltage drop across the capacitor begins at the upper threshold (UT) of the comparator $U_{11}$ (i.e., 3.35 volts) and decays of the $U_{11}$ lower threshold (UT) (i.e., 2.85 volts). It can be seen from FIG. 4b that during the time the output of the comparator is low 0 volts, the base drive circuit 14 is holding the switching transistor $Q_{11}$ OFF. However, when the voltage drop across the capacitor $C_2$ reaches the lower threshold LT, the output of the comparator $U_{11}$ goes high, the base drive circuit goes low and the switch $Q_{11}$ comes ON. Assuming that the overload or short circuit is still in place across $V_o$ when $Q_{11}$ comes ON, current flowing through $R_{12}$ will again turn ON $Q_1$. When transistor $Q_1$ turns ON it charges capacitor $C_2$ so that the output voltage of $C_2$ (see FIG. 4a) quickly reaches the new upper threshold at UT. This causes the comparator $U_{11}$ to go OFF which causes the base drive circuit to go high thereby turning OFF the switching transistor $Q_{11}$.

The dotted line in FIG. 4a shows the decay path of the capacitor $C_2$. The distance h between the lower threshold LT and the upper threshold UT is the hysteresis of the comparator of $U_{11}$. The pulse repetition frequency for the graph of FIG. 4b would be on the order of 1 kilohertz using the components specified in Table I. The dash-dot vertical lines in FIG. 4 show the time coincidences between FIGS. 4a and 4b.

The pulse width $\Delta T$ of FIG. 4b depends on the magnitude of the overload resistance. For a short circuit, $\Delta t$ will be minimum because the reset voltage for inductor $L_{11}$ is minimum. The typical range for $\Delta t$ is such that $\Delta t$ is greater than 5 microseconds and less than 50 microseconds. $\Delta T$ is approximately equal to $L_{11} \times I_1/(V_1 - V_o)$. Where $L_{11}$ is the inductance of the inductor $L_{11}$, $I_1$ is equal to $\dfrac{Q_1 \text{ ON } V_{BE}}{R_{12}} \cong \dfrac{0.06}{R_{12}}$, $V_o$ is the output voltage, and $V_1$ is equal to the unregulated input line voltage. It is seen from above that the PRF of 1000 $H_z$ is relatively independent of the magnitude of overload resistance because $1/1000 H_z >> 50$ microseconds.

The frequency of the overcurrent comparator oscillation can easily be adjusted by changing the capacitance of $C_2$. The frequency should be set as high as possible and yet be within the maximum switching speed and frequency ratings of $Q_{11}$ and $CR_{11}$. In the overcurrent limiting mode, the ON duty cycle of the switching transistor $Q_{11}$ would be very low as shown in FIG. 4b. To stay within the finite switching speed limitations of $Q_{11}$ and $CR_{11}$ the overcurrent limiting mode pulse repetition frequency should be set low; i.e., about 1,000 $H_z$.

Typical switching speed limitations for the transistor $Q_{11}$ and the diode $CR_{11}$ require that the overcurrent recycle frequency be set about 1,000 $H_z$. Again, this recycle frequency is set via the capacitor $C_2$ time constant. Minimal overcurrent foldback improves the turn ON characteristics of the power supply when driving incandescent lamps capacitors, motors and etc.

In general, the overcurrent threshold current ($I_{Thrs}$) is defined as: $I_{Thrs} = Q_1 \text{ ON } V_{BE}/R_{12} \cong 0.6$ volts/$R_{12}$. The threshold current should be set approximately a factor of 2 higher than the power supply full load current. The higher setting is to account for variations in the base emitter voltage $V_{BE}$ for the ON state of transistor $Q_1$ ($Q_1$ ON $V_{BE}$) resistor tolerances and to prevent false triggering of the overcurrent protection circuit 10.

The current through $Q_{11}$ will be a linear ramp as long as $L_{11}$ is linear. Note that the current through $Q_{11}$ will continue to ramp up even after the overcurrent comparator changes state signaling an overload current. Typically, $Q_{11}$ dows not turn OFF until a few microseconds after the comparator $U_{11}$ changes state. This "coast-up" current will be smaller with a faster switching transistor $Q_{11}$ and faster base drive circuit 14.

FIG. 2 shows a mechanization of the current limiter for two power switch transistors ($Q_{11}$ and $Q_{12}$) connected in parallel. In this embodiment, the invented circuit appears and operates the same as that of FIG. 1 with the exception that the resistor $R_1$ has been replaced with two resistors $R_1$ and $R_3$ each of which are roughly twice the size of resistor $R_1$ of FIG. 1. This allows for the dual input into the transistor $Q_1$ while retaining the RC time constant between resistors $R_1$ and $R_3$ and compacitor $C_1$. For the same switching current, the parallel operation will decrease the steady state on voltage drop by approximately a factor of 2.

In FIG. 2, resistors $R_{12}$ and $R_{20}$ serve two functions. The first is to sense the load current and the second is to help balance the steady state load current between transistors $Q_{11}$ and $Q_{12}$. The transient low currents cannot be balanced by the resistors $R_{12}$ and $R_{20}$ because one of the two transistors always switches faster. This means that during the instant of switching ON, the fastest transistor carries 100% of the switched ON current. Conversely, the slowest transistor carries 100% of the switched OFF current during the switching transient. If the transistor switching time is made very short, the instant of 100% individual conduction (theoretically 100% overload) becomes so short that transistor junction (hot spot) damage is avoided provided there is adequate base drive.

A third embodiment is shown in FIG. 3. This embodiment is shown to illustrate that the invention can be realized through the use of a single voltage regulation comparator $U_{12}$. Elimination of one comparator saves DC power and reduces the parts count for the overall circuit. Thus, the embodiment of FIG. 3 uses less standby power. This is an important attribute for space applications where power conservation simplicity and reliability are very important.

The previous discussion for the embodiments of FIGS. 1 and 2 applies here for components $R_1$, $R_2$, $C_1$ and $Q_1$. In the embodiment of FIG. 3, the capacitor $C_{101}$ in series with the capacitor $C_{102}$ corresponds with the capacitor $C_2$ of the embodiment of FIGS. 1 and 2. The diode $CR_1$ provides the 'OR' function so that either the voltage sensing circuit 16 or the overcurrent limiter circuit 10 can control the same comparator $U_{12}$.

During normal operation (no overload) the diode $CR_1$ is back biased by about 3 volts so that the overcurrent circuit does not load the voltage sensing divider consisting of resistors $R_{102}$ and $R_{103}$. These resistors provide a signal to the comparator $U_{12}$ which is compared to a reference potential through resistors $R_{13}$ through $R_{17}$ as discussed above with regard to FIG. 1 to allow the comparator $U_{12}$ to provide signals to the base drive circuit 14 for controlling the switching transistor $Q_{11}$.

When there is an overcurrent condition, the diode $CR_1$ overrides the signal from the voltage sensing divider ($R_{102}$ and $R_{103}$) and transmits the linear current ramp from $Q_1$ to the capacitors $C_{101}$ and $C_{102}$. This override signal quickly changes the state of the comparator $U_{12}$ to turn OFF the switching transistor $Q_{11}$. When the transistor $Q_{11}$ goes OFF transistor $Q_1$ goes OFF.

The current through the diode $CR_1$ places a charge voltage approximately equal the hysteresis of the comparator on the series connected capacitors $C_{101}$ and $C_{102}$. In the event that the overvoltage and overcurrent thresholds occur at the same instant, the current through the diode $CR_1$ will not add much change voltage to the capacitors $C_{101}$ and $C_{102}$. However, ½ cycle later (e.g., in about 25 microseconds) the voltage sensing circuit 16 will turn the switching transistor $Q_{11}$ back ON. Now diode $CR_1$ will act to quickly charge $C_{101}$ and $C_{102}$ to trip the threshold of $U_{12}$ which turns $Q_1$ back OFF. That is, diode $CR_1$ exponentially charges the capacitors $C_{101}$ and $C_{102}$ by the full amount of the comparator hysteresis which will turn OFF $Q_{11}$ within several microseconds. $Q_{11}$ will now stay OFF until the delta voltage, quick charged into the capacitors $C_{101}$ and $C_{102}$, decays. The decay path for the capacitor $C_{101}$ is slow because it is via the parallel combination of resistors $R_{102}$ and $R_{103}$. This quick charge, slow decay on $C_{101}$ and $C_{102}$ forms a relaxation oscillator. The function of the relaxation oscillator is the same as that discussed for FIG. 1. The frequency of the relaxation oscillator is set by the magnitude of the capacitors $C_{101}$ and $C_{102}$, the parallel resistance of the voltage divider provided by resistors $R_{102}$ and $R_{103}$, and the hysteresis voltage of $U_{12}$. The above discussion regarding the optimum frequency of this oscillator also applies to the embodiment of FIG. 3. One kilohertz is typical.

The crossover network and the voltage sensing circuit 16 places some limitations on the range of values for the capacitors 101 and $C_{102}$. However, a compromise can be reached so that both this overcurrent sensing circuit and the voltage sensing circuit 16 work well together.

TABLE I

| Components | Specification |
|---|---|
| Resistors | Ohms |
| $R_1$ | 100 |
| $R_2$ | 100 |
| $R_3$ | 220 |
| $R_4$ | 10k |
| $R_{12}$ | 0.05 |
| $R_{13}$ | 1.74k |
| $R_{14}$ | 115k |
| $R_{15}$ | 20.5k |
| $R_{16}$ | 28k |
| $R_{17}$ | 20.5k |
| $R_{18}$ | 17.4k |
| $R_{19}$ | 220 |
| $R_{20}$ | 0.05 |
| $R_{101}$ | 1k |
| $R_{102}$ | 64.9k |
| $R_{103}$ | 22.1k |
| Capacitors | Farads |
| $C_1$ | 0.01μ |
| $C_2$ | 0.1μ |
| $C_{101}$ | 1μ |
| $C_{102}$ | 1μ |
| $C_{11}$ | 100 pico |
| Inductors $L_{11}$ | Diodes |
| $CR_1$ | 1N4150 |
| $CR_{11}$ | 1N3891 |
| Transistors | |
| $Q_1$ | 2N5680 |
| $Q_{11}$ | 2N6287 |
| $Q_{12}$ | 2N6287 |
| Amplifiers | |
| $U_{11}$ | LM139 |
| $U_{12}$ | LM139 |

While the present invention has been described herein with reference to particular embodiments for a particular application, it is to be understood that the invention is not limited thereto. Those having ordinary skill in the art and access to the teachings of this invention will recognize modifications within the scope thereof. For example, while the above-described embodiments show hysteresis comparator type switching regulators, it is understood the invention is applicable to clocked comparator type switching regulators. It is contemplated by the appended claims to cover any and all such modifications.

What is claimed is:

1. In a switching regulator power supply having a switching transistor for delivering power to a load connected to an output terminal thereof and control means for activating and deactivating said transistor on receipt of predetermined input signls; a circuit for controlling the switching transistor to limit the current therethrough whenever the load is substantially overloaded, said circuit comprising:
   first means for sensing the current through said switching transistor, including a current sensing resistor for developing a first voltage in response to the current through the switching transistor, said current sensing resistor being connected between a source of electrical energy and a terminal of the switching transistor and filter means for mitigating the effects of switching regulator transients, said filter means being connected to
   second means for providing to said control means a control signal whenever the current through said switching transistor exceeds a predetermined threshold, said second means including a current generator having a bipolar transistor biased for nominal operation in its active mode and being responsive to the current sensed in the switching transistor, means for developing a second voltage signal relative to ground level in response to the output of the current generator, and a threshold detector for comparing the second developed voltage to a reference potential and to generate said control signal to said control means to deactivate the switching transistor whenever the sensed current exceeds a predetermined threshold.

2. The circuit of claim 1 wherein said means for developing said second voltage signal includes a capacitor connected between the current generator and ground.

3. The circuit of claim 1 wherein said current generator includes means for providing parasitic oscillation suppression.

4. In a switching regulator power supply having a switching transistor for delivering power to a load connected to an output terminal thereof and control means for activating and deactivating said transistor on receipt of predetermined input signals; a circuit for controlling the switching transistor to limit the current therethrough whenever the load is substantially overloaded, said circuit comprising:
   first means for sensing the current through said switching transistor including filter means for mitigating the effects of switching regulator transients, said filter means being connected to
   second means for providing to said control means a control signal whenever the current through said switching transistor exceeds a predetermined threshold, said second means including a current generator responsive to the current sensed in the switching transistor, means for developing a second voltage signal relative to ground level in response to the output of the current generator, and a threshold detector for comparing the second developed voltage to a reference potential and to generate said control signal for said control means to deactivate the switching transistor whenever the sensed current exceeds a predetermined level.

5. The circuit of claim 4 wherein said first means includes a current sensing resistor connected between a source of electrical energy and a terminal of said switching transistor.

6. The circuit of claim 4 wherein said current generator includes a bipolar transistor biased for nominal operation in its active mode.

7. The circuit of claim 4 wherein said means for developing a voltage at ground level includes a capacitor connected between the current generator and ground.

8. The circuit of claim 4 wherein said current generator includes means for providing parasitic oscillation suppression.

9. In a switching regulator power supply having a switching transistor for delivering power to a load connected to an output terminal thereof and control means for activating and deactivating said transistor on receipt of predetermined input signals; a circuit for controlling the switching transistor to limit the current therethrough whenever the load is substantially overloaded, said circuit comprising:

first means for sensing the current through said switching transistor including filter means for mitigating the effects of switching regulator transients, said filter means being connected to second means for providing to said control means a control signal whenever the current through said switching transistor exceeds a predetermined threshold.

10. the circuit of claim 9 wherein said first means includes a current sensing resistor connected between a source of electrical energy and a terminal of said switching transistor.

* * * * *